United States Patent
Ikebe

(10) Patent No.: US 12,228,852 B2
(45) Date of Patent: Feb. 18, 2025

(54) REFLECTIVE MASK BLANK, REFLECTIVE MASK AND METHOD FOR MANUFACTURING A SEMICONDUCTOR DEVICE

(71) Applicant: HOYA CORPORATION, Tokyo (JP)

(72) Inventor: Yohei Ikebe, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 18/528,544

(22) Filed: Dec. 4, 2023

(65) Prior Publication Data

US 2024/0103355 A1 Mar. 28, 2024

Related U.S. Application Data

(63) Continuation of application No. 17/311,662, filed as application No. PCT/JP2019/050236 on Dec. 23, 2019, now Pat. No. 11,914,281.

(30) Foreign Application Priority Data

Dec. 27, 2018 (JP) ................................ 2018-244406

(51) Int. Cl.
 G03F 1/24 (2012.01)
 G03F 1/26 (2012.01)

(52) U.S. Cl.
 CPC . *G03F 1/24* (2013.01); *G03F 1/26* (2013.01)

(58) Field of Classification Search
 CPC ...................................... G03F 1/24; G03F 1/26
 USPC ............................................................ 430/5
 See application file for complete search history.

(56) References Cited

U.S. PATENT DOCUMENTS

| | | |
|---|---|---|
| 2005/0186486 A1 | 8/2005 | Sugawara |
| 2011/0104595 A1 | 5/2011 | Hayashi et al. |
| 2011/0281207 A1 | 11/2011 | Hosoya |
| 2013/0115547 A1 | 5/2013 | Mikami et al. |
| 2013/0157177 A1 | 6/2013 | Yu et al. |
| 2013/0260288 A1 | 10/2013 | Yu et al. |
| 2013/0316272 A1 | 11/2013 | Hayashi et al. |
| 2016/0124298 A1 | 5/2016 | Hamamoto et al. |
| 2017/0038673 A1 | 2/2017 | Ikebe et al. |
| 2017/0315439 A1 | 11/2017 | Hamamoto et al. |
| 2018/0299766 A1 | 10/2018 | Tanabe |
| 2018/0356719 A1 | 12/2018 | Ikebe et al. |
| 2019/0079383 A1 | 3/2019 | Ikebe |

FOREIGN PATENT DOCUMENTS

| | | |
|---|---|---|
| CN | 103026296 A | 4/2013 |
| EP | 1566691 A2 | 8/2005 |
| JP | 2002280291 A | 9/2002 |
| JP | 2004207593 A | 7/2004 |
| JP | 2009046770 A | 3/2009 |
| JP | 2010080659 A | 4/2010 |
| JP | 2010206156 A | 9/2010 |
| JP | 2015122468 A | 7/2015 |
| JP | 2015-142083 A | 8/2015 |
| JP | 2016046370 A | 4/2016 |
| JP | 2018-173664 A | 11/2018 |
| JP | 2018180544 A | 11/2018 |
| KR | 10-2011-0050427 | 5/2011 |
| TW | 201730663 A | 9/2017 |
| TW | 201826009 A | 7/2018 |
| WO | 2017169658 A1 | 10/2017 |

OTHER PUBLICATIONS

TW112142634, "Office Action", May 20, 2024, 7 pages.
JP2023-045256, "Notice of Reasons for Refusal" with Machine Translation, Jan. 9, 2024, 6 pages.
U.S. Appl. No. 17/311,662, "Notice of Allowance", Oct. 30, 2023, 7 pages.
JP2018-244406, "Notice of Reasons for Refusal" with Machine Translation, Sep. 6, 2022, 5 pages.
PCT/JP2019/050236, English Translation of International Search Report, Mar. 10, 2020, 2 pages.
TW108147516, "Office Action", Apr. 20, 2023, 6 pages.
Office Action dated Dec. 17, 2024 issued in Korean Patent Office in Application No. 10-2021-7014007.

*Primary Examiner* — Christopher G Young
(74) *Attorney, Agent, or Firm* — Kilpatrick Townsend & Stockton LLP

(57) ABSTRACT

A reflective mask blank comprises a substrate; a multilayer reflective film which is formed on the substrate and reflects EUV light; and a layered film which is formed on the multilayer reflective film. The layered film has an absolute reflectance of 2.5% or less with respect to EUV light, and comprises a first layer and a second layer that is formed on the first layer; and the first layer comprises a phase shift film which shifts the phase of EUV light. Alternatively, the layered film is a phase shift film which comprises a first layer and a second layer that is formed on the first layer, and which shifts the phase of EUV light; and the first layer comprises an absorption layer that has an absolute reflectance of 2.5% or less with respect to EUV light.

17 Claims, 4 Drawing Sheets

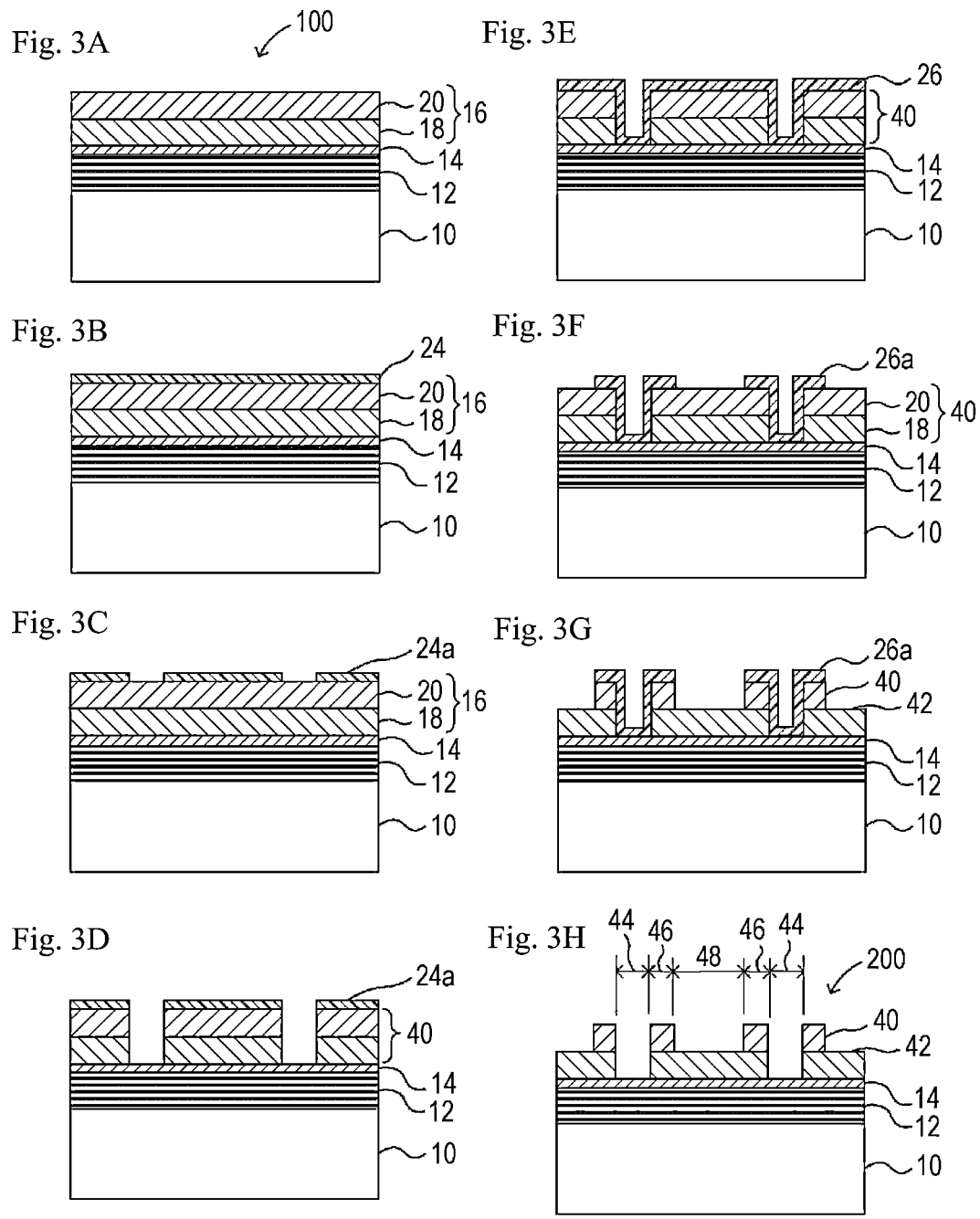

REFLECTIVE MASK BLANK, REFLECTIVE MASK AND METHOD FOR MANUFACTURING A SEMICONDUCTOR DEVICE

CROSS-REFERENCE TO RELATED APPLICATIONS

This application is a continuation of U.S. application Ser. No. 17/311,662, filed Jun. 7, 2021, which is a National Stage of International Application No. PCT/JP2019/050236, filed Dec. 23, 2019, which claims priority to Japanese Patent Application No. 2018-244406, filed Dec. 27, 2018, and the contents of which is incorporated by reference.

TECHNICAL FIELD

The present disclosure relates to a reflective mask blank that is an original plate for manufacturing a light exposure mask used, for example, for manufacturing a semiconductor device, a reflective mask, and a method for manufacturing a semiconductor device.

BACKGROUND ART

The type of light source in a light exposure device used for manufacturing a semiconductor device has developed with gradually shortening a wavelength, such as a g-ray with a wavelength of 436 nm, an i-ray with a wavelength of 365 nm, a KrF laser with a wavelength of 248 nm, and an ArF laser with a wavelength of 193 nm. EUV lithography using an extreme ultra violet (EUV) ray with a wavelength near 13.5 nm has been developed in order to achieve finer pattern transfer. In the EUV lithography, a reflective mask is used because there are few materials transparent to EUV light. This reflective mask has a basic structure in which a multilayer reflective film that reflects exposure light is formed on a low thermal expansion substrate and a desired pattern for transfer is formed on a protective film for protecting the multilayer reflective film. In addition, based on a structure of the pattern for transfer, typical examples of the reflective mask include: a binary type reflection mask having a relatively thick absorber pattern that sufficiently absorbs EUV light; and a phase shift type reflection mask (half-tone phase shift type reflection mask) having a relatively thin absorber pattern (phase shift pattern) that reduces EUV light by light absorption and generates reflected light having a phase substantially inverted (phase inverted by approximately 180 degrees) with respect to reflected light from a multilayer reflective film. This phase shift type reflection mask has a resolution improving effect because high transfer optical image contrast can be obtained by a phase shift effect like a transmission type optical phase shift mask. In addition, since the film thickness of the absorber pattern (phase shift pattern) of the phase shift type reflection mask is thin, an accurate and fine phase shift pattern can be formed.

CITATION LIST

Patent Literature

Patent Literature 1: JP 2010-080659 A
Patent Literature 2: JP 2004-207593 A

SUMMARY OF DISCLOSURE

Technical Problem

Generally, when the relative reflectance of the phase shift film (phase shift pattern) is, for example, 3% to 40%, a resolution improving effect can be obtained. Here, the "relative reflectance" is a reflectance of EUV light reflected by a phase shift pattern when a reflectance of EUV light reflected by a multilayer reflective film (including a multilayer reflective film with a protective film) in a portion having no phase shift pattern is assumed to be 100%.

Generally, an effect of the phase shift film on light exposure becomes more remarkable as the phase shift film has a higher reflectance. When the effect of the phase shift film on light exposure is increased, the contrast of a pattern transfer image is increased. Therefore, resolution is improved, and a throughput in manufacturing a semiconductor device is improved.

However, when the reflectance of the phase shift film is increased, the amount of light reflected by the phase shift film is increased. Therefore, a resist film in a region not to be photosensitized normally during pattern transfer is photosensitized. In this case, it is difficult to accurately transfer a desired pattern onto a transfer target disadvantageously.

When a semiconductor device is manufactured, one transfer target (silicon wafer or the like) on which a resist film is formed is exposed to light a plurality of times using the same photomask while the position of the transfer target is shifted. However, as the reflectance of the phase shift film is increased, the amount of light reflected by the phase shift film is increased. Therefore, by one light exposure, not only a resist film in a region onto which a pattern is to be transferred but also a resist film in another region adjacent to the region onto which a pattern is to be transferred is photosensitized. In this case, since a resist film near a boundary between two adjacent regions is exposed to light a plurality of times, the resist film near the boundary is photosensitized, and it is difficult to accurately transfer a desired pattern onto a transfer target disadvantageously.

In view of the above problem, an aspect of the present disclosure is to provide a reflective mask blank capable of accurately transferring a pattern onto a transfer target, a reflective mask, and a method for manufacturing a semiconductor device.

Solution to Problem

In order to solve the above problems, the present disclosure has the following configurations.
(Configuration 1)
A reflective mask blank including a substrate, a multilayer reflective film that is formed on the substrate and reflects EUV light, and a layered film formed on the multilayer reflective film, in which
the layered film includes a first layer and a second layer formed on the first layer, and has an absolute reflectance of 2.5% or less with respect to the EUV light, and
the first layer includes a phase shift film that shifts the phase of the EUV light.
(Configuration 2)
The reflective mask blank according to configuration 1, in which the second layer is an interference layer that reduces the absolute reflectance of the layered film to 2.5% or less by utilizing optical interference.
(Configuration 3)
The reflective mask blank according to configuration 2, in which the interference layer has a film thickness of 1 nm or more and 20 nm or less and a refractive index n of 0.85 or more and 0.96 or less.

(Configuration 4)

The reflective mask blank according to configuration 2 or 3, in which the interference layer includes a material containing ruthenium (Ru).

(Configuration 5)

The reflective mask blank according to configuration 1, in which the second layer is an absorption layer that reduces the absolute reflectance of the layered film to 2.5% or less by utilizing a light absorbing effect.

(Configuration 6)

The reflective mask blank according to configuration 5, in which the absorption layer has a film thickness of 5 nm or more and 70 nm or less and an extinction coefficient k of 0.02 or more.

(Configuration 7)

The reflective mask blank according to configuration 5 or 6, in which the absorption layer includes a material containing at least one element selected from the group consisting of tantalum (Ta), chromium (Cr), cobalt (Co), and nickel (Ni).

(Configuration 8)

The reflective mask blank according to any one of configurations 1 to 7, in which the first layer has a relative reflectance of 3% or more and 40% or less and a phase difference of 160 to 200° with respect to the EUV light.

(Configuration 9)

The reflective mask blank according to any one of configurations 1 to 8, in which the first layer has a film thickness of 5 nm or more and 70 nm or less and a refractive index n of 0.85 or more and 0.96 or less.

(Configuration 10)

The reflective mask blank according to any one of configurations 1 to 9, in which the first layer includes a material containing at least one element selected from the group consisting of tantalum (Ta), titanium (Ti), ruthenium (Ru), and chromium (Cr).

(Configuration 11)

A reflective mask blank including a substrate, a multilayer reflective film that is formed on the substrate and reflects EUV light, and a layered film formed on the multilayer reflective film, in which the layered film is a phase shift film that includes a first layer and a second layer formed on the first layer, and shifts the phase of the EUV light, and the first layer includes an absorption layer having an absolute reflectance of 2.5% or less with respect to the EUV light.

(Configuration 12)

The reflective mask blank according to configuration 11, in which the second layer is an interference layer that shifts the phase of EUV light reflected by the layered film by utilizing optical interference.

(Configuration 13)

The reflective mask blank according to configuration 11 or 12, in which the second layer has a film thickness of 1 nm or more and 20 nm or less and a refractive index n of 0.85 or more and 0.96 or less.

(Configuration 14)

The reflective mask blank according to any one of configurations 11 to 13, in which the second layer includes a material containing ruthenium (Ru).

(Configuration 15)

The reflective mask blank according to any one of configurations 11 to 14, in which the first layer has a film thickness of 5 nm or more and 70 nm or less and an extinction coefficient k of 0.02 or more.

(Configuration 16)

The reflective mask blank according to any one of configurations 11 to 15, in which the first layer includes a material containing at least one element selected from the group consisting of tantalum (Ta), chromium (Cr), cobalt (Co), and nickel (Ni).

(Configuration 17)

The reflective mask blank according to any one of configurations 11 to 16, in which the layered film has a relative reflectance of 3% or more and 40% or less and a phase difference of 160 to 200° with respect to the EUV light.

(Configuration 18)

The reflective mask blank according to any one of configurations 1 to 17, further including a protective film between the multilayer reflective film and the first layer, in which the protective film contains at least one material selected from the group consisting of a material containing ruthenium (Ru), a material containing silicon (Si) and oxygen (O), a material containing yttrium (Y) and oxygen (O), and a material containing chromium (Cr).

(Configuration 19)

A reflective mask having a layered film pattern in which the layered film in the reflective mask blank according to any one of configurations 1 to 18 is patterned.

(Configuration 20)

A method for manufacturing a semiconductor device, the method including a step of forming a transfer pattern on a semiconductor substrate using the reflective mask according to configuration 19.

Advantageous Effects of Disclosure

The present disclosure can provide a reflective mask blank capable of accurately transferring a pattern onto a transfer target, a reflective mask, and a method for manufacturing a semiconductor device.

BRIEF DESCRIPTION OF DRAWINGS

FIGS. 3A-3H are schematic views illustrating a method for manufacturing a reflective mask in a case where an aspect of a layered film is (2).

DESCRIPTION OF EMBODIMENTS

Hereinafter, an embodiment of the present disclosure will be specifically described with reference to the drawings. Note that the following embodiment does not limit the scope of the present disclosure.

Figure 1:
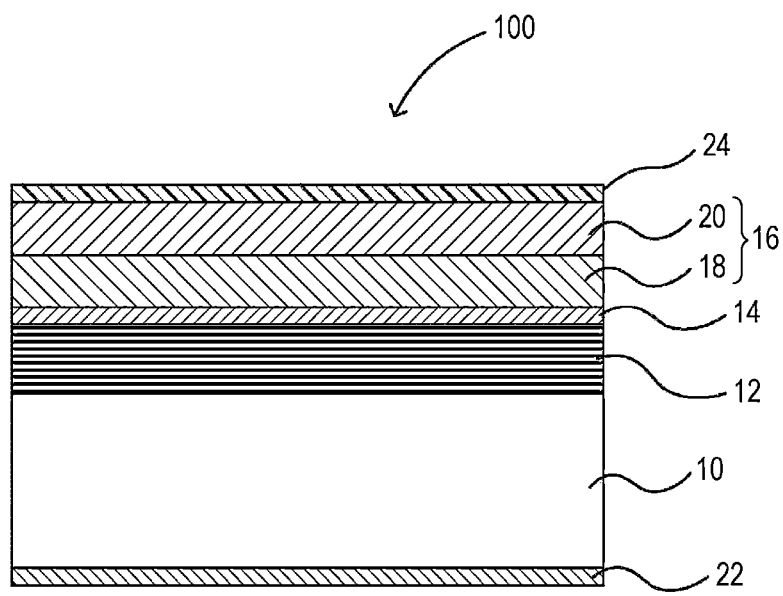
FIG. 1 is a schematic cross-sectional view of a main part of a reflective mask blank.

FIG. 1 is a schematic cross-sectional view of a main part of a reflective mask blank 100 of the present embodiment. As illustrated in FIG. 1, the reflective mask blank 100 includes a substrate 10, a multilayer reflective film 12 formed on the substrate 10, a protective film 14 formed on the multilayer reflective film 12, and a layered film 16 formed on the protective film 14. The layered film 16 includes a first layer 18 formed on the protective film 14 in contact with the protective film 14 and a second layer 20 formed on the first layer 18. Meanwhile, a conductive back film 22 for electrostatic chuck is formed on a back surface of the substrate 10 (surface opposite to the side where the multilayer reflective film 12 is formed).

Note that here, "on" a substrate or a film includes not only a case of being in contact with a top surface of the substrate or the film but also a case of being not in contact with the top surface of the substrate or the film. That is, "on" a substrate or a film includes a case where a new film is formed above the substrate or the film, a case where another film is interposed between the substrate or the film and an object "on" the substrate or the film, and the like. In addition, "on" does not necessarily mean an upper side in the vertical direction. "On" merely indicates a relative positional relationship among a substrate, a film, and the like.

<Substrate>

As the substrate 10, a substrate having a low thermal expansion coefficient within a range of 0±5 ppb/° C. is preferably used in order to prevent distortion of a transfer pattern due to heat during exposure to EUV light. As a material having a low thermal expansion coefficient within this range, for example, $SiO_2$—$TiO_2$-based glass or multi-component-based glass ceramic can be used.

A main surface of the substrate 10 on a side where a transfer pattern (a phase shift pattern, an absorption layer pattern and/or a layered film pattern described later) is formed is preferably processed in order to increase a flatness. By increasing the flatness of the main surface of the substrate 10, position accuracy and transfer accuracy of the pattern can be increased. For example, in a case of EUV exposure, the flatness in a region of 132 mm×132 mm of the main surface of the substrate 10 on the side where the transfer pattern is formed is preferably 0.1 μm or less, more preferably 0.05 μm or less, and particularly preferably 0.03 μm or less. A main surface (back surface) on a side opposite to the side where the transfer pattern is formed is a surface to be fixed to a light exposure device by electrostatic chuck, and the flatness in a region of 142 mm×142 mm of the main surface (back surface) is preferably 0.1 μm or less, more preferably 0.05 μm or less, and particularly preferably 0.03 μm or less. Note that here, the flatness is a value indicating warp (deformation amount) of a surface, expressed by total indicated reading (TIR), and an absolute value of a difference in height between the highest position of a substrate surface above a focal plane and the lowest position of the substrate surface below the focal plane, in which the focal plane is a plane defined by a minimum square method using the substrate surface as a reference.

In a case of EUV exposure, the main surface of the substrate 10 on the side where the transfer pattern is formed preferably has a surface roughness of 0.1 nm or less in terms of root mean square roughness (Rq). Note that the surface roughness can be measured with an atomic force microscope.

The substrate 10 preferably has a high rigidity in order to prevent deformation of a film (such as the multilayer reflective film 12) formed on the substrate 10 due to a film stress. In particular, the substrate 10 preferably has a high Young's modulus of 65 GPa or more.

<Multilayer Reflective Film>

The multilayer reflective film 12 has a structure in which a plurality of layers mainly containing elements having different refractive indices is periodically layered. Generally, the multilayer reflective film 12 is formed of a multilayer film in which a thin film (high refractive index layer) of a light element that is a high refractive index material or a compound of the light element and a thin film (low refractive index layer) of a heavy element that is a low refractive index material or a compound of the heavy element are alternately layered for about 40 to 60 periods.

In order to form the multilayer reflective film 12, the high refractive index layer and the low refractive index layer may be layered in this order from the substrate 10 side for a plurality of periods. In this case, one (high refractive index layer/low refractive index layer) stack is one period.

In order to form the multilayer reflective film 12, the low refractive index layer and the high refractive index layer may be layered in this order from the substrate 10 side for a plurality of periods. In this case, one (low refractive index layer/high refractive index layer) stack is one period.

Note that an uppermost layer of the multilayer reflective film 12, that is, a surface layer of the multilayer reflective film 12 on a side opposite to the substrate 10 is preferably formed of the high refractive index layer. When the high refractive index layer and the low refractive index layer are built up in this order from the substrate 10 side, the low refractive index layer forms the uppermost layer. However, when the low refractive index layer forms a surface of the multilayer reflective film 12, the reflectance of the surface of the multilayer reflective film is reduced due to easy oxidation of the low refractive index layer. Therefore, the high refractive index layer is preferably formed on the low refractive index layer. Meanwhile, when the low refractive index layer and the high refractive index layer are built up in this order from the substrate 10 side, the high refractive index layer forms the uppermost layer. In this case, the high refractive index layer forming the uppermost layer forms a surface of the multilayer reflective film 12.

In the present embodiment, the high refractive index layer may contain Si.

The high refractive index layer may contain a simple substance of Si or a Si compound.

The Si compound may contain Si and at least one element selected from the group consisting of B, C, N, and O. By using the layer containing Si as the high refractive index layer, a multilayer reflective film having an excellent reflectance of EUV light can be obtained.

In the present embodiment, the low refractive index layer may contain at least one element selected from the group consisting of Mo, Ru, Rh, and Pt, or may contain an alloy containing at least one element selected from the group consisting of Mo, Ru, Rh, and Pt.

For example, as the multilayer reflective film 12 for EUV light having a wavelength of 13 to 14 nm, a Mo/Si multilayer film in which a Mo film and a Si film are alternately layered for about 40 to 60 periods can be preferably used. In addition, as the multilayer reflective film used in a region of EUV light, for example, a Ru/Si periodic multilayer film, a Mo/Be periodic multilayer film, a Mo compound/Si compound periodic multilayer film, a Si/Nb periodic multilayer film, a Si/Mo/Ru periodic multilayer film, a Si/Mo/Ru/Mo periodic multilayer film, or a Si/Ru/Mo/Ru periodic multilayer film can be used. A material of the multilayer reflective film can be selected considering a light exposure wavelength.

The reflectance of such a multilayer reflective film 12 alone is, for example, 65% or more. An upper limit of the reflectance of the multilayer reflective film 12 is, for example, 73%. Note that the thicknesses and period of layers included in the multilayer reflective film 12 can be selected so as to satisfy Bragg's law.

The multilayer reflective film 12 can be formed by a known method. The multilayer reflective film 12 can be formed by, for example, an ion beam sputtering method.

For example, when the multilayer reflective film 12 is a Mo/Si multilayer film, a Mo film having a thickness of about 3 nm is formed on the substrate 10 by an ion beam sputtering method using a Mo target. Next, a Si film having a thickness of about 4 nm is formed using a Si target. By repeating such an operation, the multilayer reflective film 12 in which Mo/Si films are layered for 40 to 60 periods can be formed. At this time, a surface layer of the multilayer reflective film 12 on a side opposite to the substrate 10 is a layer containing Si (Si film). The Mo/Si film in one period has a thickness of 7 nm.

<Protective Film>

The protective film 14 can be formed on the multilayer reflective film 12 or in contact with a surface of the multilayer reflective film 12 in order to protect the multilayer reflective film 12 from dry etching and cleaning in a process of manufacturing a reflective mask 200 described later. The protective film 14 also has a function of protecting the multilayer reflective film 12 when a black defect in a transfer pattern is corrected using an electron beam (EB). Here, although FIG. 1 illustrates a case where the protective film 14 has one layer, the protective film 14 may have a stack of two or more layers. The protective film 14 is preferably formed of a material having resistance to an etchant and a cleaning liquid used when the first layer 18 is patterned. By forming the protective film 14 on the multilayer reflective film 12, damage to the surface of the multilayer reflective film 12 can be suppressed when the reflective mask 200 is manufactured. As a result, a reflectance characteristic of the multilayer reflective film 12 with respect to EUV light is improved. In order to obtain such an effect, the protective film 14 preferably has a thickness of 1 nm or more and 20 nm or less.

In the reflective mask blank 100 of the present embodiment, as a material of the protective film 14, a material having resistance to an etching gas used for dry etching for patterning the first layer 18 formed on the protective film 14 can be used. In a case where the first layer 18 is formed of a plurality of layers, as a material of the protective film 14 in contact with the first layer 18 (an uppermost layer of the protective film 14 in a case where the protective film 14 includes a plurality of layers), a material having resistance to an etching gas used for dry etching for patterning a lowermost layer of the first layer 18 (a layer in contact with the protective film 14) among layers forming the first layer 18 can be used. The material of the protective film 14 is preferably a material with which an etching selection ratio of the lowermost layer of the first layer 18 to the protective film 14 (an etching rate of the lowermost layer of the first layer 18/an etching rate of the protective film 14) is 1.5 or more and preferably 3 or more.

For example, in a case where the lowermost layer of the first layer 18 is a thin film formed of a material containing a metal containing ruthenium (Ru) and at least one element of chromium (Cr), nickel (Ni), and cobalt (Co) (a predetermined Ru-based material) or a material containing a metal containing ruthenium (Ru) and at least one element of vanadium (V), niobium (Nb), molybdenum (Mo), tungsten (W), and rhenium (Re) (a predetermined Ru-based material), the lowermost layer of the first layer 18 can be etched by a dry etching gas using a mixed gas of a chlorine-based gas and an oxygen gas or an oxygen gas. As the material of the protective film 14 having resistance to this etching gas, a silicon-based material such as silicon (Si), a material containing silicon (Si) and oxygen (O), or a material containing silicon (Si) and nitrogen (N) can be selected. Therefore, in a case where the lowermost layer of the first layer 18 in contact with a surface of the protective film 14 is a thin film formed of the predetermined Ru-based material, the protective film 14 is preferably formed of the silicon-based material described above. The silicon-based material described above has resistance to a dry etching gas using a mixed gas of a chlorine-based gas and an oxygen gas or an oxygen gas, and the resistance increases as the content of oxygen increases. Therefore, the material of the protective film 14 is more preferably silicon oxide ($SiO_x$, $1 \leq x \leq 2$). A larger value of x is still more preferable. The material of the protective film 14 is particularly preferably $SiO_2$.

In a case where the lowermost layer of the first layer 18 in contact with the surface of the protective film 14 is a thin film formed of a material containing tantalum (Ta), the lowermost layer of the first layer 18 can be etched by dry etching using a halogen-based gas containing no oxygen gas. As a material of the protective film 14 having resistance to this etching gas, a material containing ruthenium (Ru) as a main component can be used.

In a case where the lowermost layer of the first layer 18 in contact with the surface of the protective film 14 is a thin film formed of a material containing chromium (Cr), the lowermost layer of the first layer 18 can be etched by dry etching using a dry etching gas that is a chlorine-based gas containing no oxygen gas or a mixed gas of an oxygen gas and a chlorine-based gas. As a material of the protective film 14 having resistance to this etching gas, a material containing ruthenium (Ru) as a main component can be used.

In a case where the lowermost layer of the first layer 18 is a material containing tantalum (Ta) or chromium (Cr), the material of the protective film 14 that can be used is a material containing ruthenium as a main component as described above. Specific examples of the material containing ruthenium as a main component include a simple substance of a Ru metal, a Ru alloy containing Ru and at least one metal selected from the group consisting of titanium (Ti), niobium (Nb), molybdenum (Mo), zirconium (Zr), yttrium (Y), boron (B), lanthanum (La), cobalt (Co), and rhenium (Re), a material containing a Ru metal and nitrogen, and a material containing a Ru alloy and nitrogen.

When the lowermost layer of the first layer 18 is formed of a material containing tantalum (Ta) or chromium (Cr), the lowermost layer and the uppermost layer of the protective film 14 can be formed of the above material containing ruthenium as a main component. A layer between the lowermost layer and the uppermost layer can be formed of a metal other than Ru or an alloy containing the metal.

The Ru content ratio of the Ru alloy is 50 atomic % or more and less than 100 atomic %, preferably 80 atomic % or more and less than 100 atomic %, and more preferably 95 atomic % or more and less than 100 atomic %. In particular, when the Ru content ratio of the Ru alloy is 95 atomic % or more and less than 100 atomic %, diffusion of an element (silicon) constituting the multilayer reflective film 12 to the protective film 14 can be suppressed. In addition, cleaning resistance of a mask can be improved while the reflectance of EUV light is sufficiently ensured. Furthermore, the protective film 14 functions as an etching stopper when the first layer 18 is etched. In addition, the protective film 14 can prevent the multilayer reflective film 12 from changing with time.

As the material of the protective film 14, a compound containing Ru, for example, a material containing at least one selected from the group consisting of RuNb, RuN, and RuTi can be used. In addition, as the material of the protective film 14, a compound containing Y and O, for example, a material containing $Y_2O_3$ can be used. In addition, as the material of the protective film 14, a compound containing Cr, for example, a material containing CrN can be used.

The thickness of the protective film 14 is not particularly limited as long as the protective film 14 can protect the multilayer reflective film 12. The thickness of the protective film 14 is preferably 1.0 nm to 8.0 nm, and more preferably 1.5 nm to 6.0 nm from a viewpoint of the reflectance of EUV light.

As a method for forming the protective film 14, a known method can be used. Examples of the method for forming the protective film 14 include a sputtering method and an ion beam sputtering method.

The reflective mask blank 100 further includes the conductive back film 22 on a main surface of the substrate 10 opposite to a side where the multilayer reflective film 12 is formed. The conductive back film 22 is used when the reflective mask blank 100 is adsorbed by electrostatic chuck.

The reflective mask blank 100 may include a base film formed between the substrate 10 and the multilayer reflective film 12. The base film is formed, for example, for the purpose of improving smoothness of a surface of the substrate 10. The base film is formed, for example, for the purpose of reducing defects, improving the reflectance of the multilayer reflective film, or correcting a stress of the multilayer reflective film.

<Layered Film>

The reflective mask blank 100 of the present embodiment includes the layered film 16 formed on the multilayer reflective film 12 (or the multilayer reflective film 12 with the protective film 14). The layered film 16 has a stack including the first layer 18 formed so as to be in contact with the protective film 14 and the second layer 20 formed on the first layer 18.

In the reflective mask blank 100 of the present embodiment, the layered film 16 has the following two aspects.

(1) The layered film 16 including the first layer 18 and the second layer 20 has an absolute reflectance of 2.5% or less with respect to EUV light (binary type), and the first layer 18 (lower layer) functions as a phase shift film (phase shift type).

(2) The layered film 16 including the first layer 18 and the second layer 20 functions as a phase shift film (phase shift type), and the first layer 18 (lower layer) has an absolute reflectance of 2.5% or less with respect to EUV light (binary type).

TABLE 1

| | Aspect of layered film | |
|---|---|---|
| | (1) | (2) |
| First layer + Second layer (Layered film) | Binary type | Phase shift film (Phase shift type) |
| First layer (Lower layer) | Phase shift film (Phase shift type) | Binary type |

[Case where the Aspect of the Layered Film is the Above (1)]

First, the case where the aspect of the layered film 16 is the above (1) will be described.

In the case of the above (1), the layered film 16 including the first layer 18 and the second layer 20 has a reflectance (absolute reflectance) of 2.5% or less, preferably 2% or less with respect to EUV light. The "absolute reflectance" referred to here means the reflectance of EUV light reflected by the layered film 16 (a ratio between incident light intensity and reflected light intensity).

In the case of the above (1), the first layer 18 (lower layer) is formed of a phase shift film that shifts the phase of EUV light. The reflectance (relative reflectance) of the first layer 18 with respect to EUV light is preferably 3% or more and 40% or less (absolute reflectance: 2% to 27%). Here, the "relative reflectance" is the reflectance of EUV light reflected by a phase shift pattern (phase shift film) when the reflectance of EUV light reflected by the multilayer reflective film 12 (including the multilayer reflective film 12 with the protective film 14) in a portion having no phase shift pattern (phase shift film) is assumed to be 100%.

EUV light reflected by the first layer 18 preferably has a phase difference of 160 to 200° with respect to EUV light reflected by the multilayer reflective film 12 (including the multilayer reflective film 12 with the protective film 14) exposed by removing the first layer 18 by etching or the like. That is, the first layer 18 is preferably formed of a phase shift film that causes a phase difference of 160 to 200° with respect to EUV light.

In order to obtain a sufficient phase shift effect, the first layer 18 has a film thickness of preferably 5 nm or more and 70 nm or less, more preferably 10 nm or more and 50 nm or less. In addition, the first layer 18 has a refractive index n of preferably 0.85 or more and 0.96 or less, more preferably 0.88 or more and 0.96 or less.

The first layer 18 is formed of a material containing at least one element selected from, for example, the group consisting of tantalum (Ta), chromium (Cr), ruthenium (Ru), and titanium (Ti).

Examples of a material containing tantalum (Ta) include a material containing tantalum (Ta) and at least one element selected from the group consisting of oxygen (O), nitrogen (N), carbon (C), boron (B), and hydrogen (H). Among these materials, a material containing tantalum (Ta) and nitrogen (N) is preferable. Specific examples of such a material include tantalum nitride (TaN), tantalum oxynitride (TaON), tantalum boride nitride (TaBN), and tantalum boride oxynitride (TaBON).

In a case where the first layer 18 contains Ta and N, the composition range (atomic ratio) of Ta and N is preferably 3:1 to 20:1, and more preferably 4:1 to 12:1.

Examples of a material containing chromium (Cr) include a material containing chromium (Cr) and at least one element selected from the group consisting of oxygen (O), nitrogen (N), carbon (C), boron (B), and hydrogen (H). Among these materials, a material containing chromium (Cr) and nitrogen (N) and/or carbon (C) is preferable. Specific examples of such a material include chromium nitride (CrN), chromium oxynitride (CrON), chromium carbide (CrC), chromium oxide carbide (CrOC), chromium carbide nitride (CrCN), and chromium oxide carbide nitride (CrOCN).

In a case where the first layer 18 contains Cr and N, the composition range (atomic ratio) of Cr and N is preferably 30:1 to 3:2, and more preferably 20:1 to 2:1. In a case where the first layer 18 contains Cr and C, the composition range (atomic ratio) of Cr and C is preferably 5:2 to 20:1, and more preferably 3:1 to 12:1.

Examples of a material containing ruthenium (Ru) include a simple substance of ruthenium (Ru), ruthenium nitride (RuN), and a material containing ruthenium (Ru) and at least one element selected from the group consisting of chromium (Cr), nickel (Ni), cobalt (Co), vanadium (V), niobium (Nb), molybdenum (Mo), tungsten (W), and rhenium (Re).

The refractive index n of Ru is n=0.886 (extinction coefficient k=0.017), and Ru is preferable as a material of a phase shift film having a high reflectance. However, a Ru-based compound such as RuO is likely to have a crystallized structure and has poor processing characteristics. That is, a crystal particle of a crystallized metal is likely to cause a large sidewall roughness when a phase shift pattern is formed. Therefore, this may have an adverse effect when a predetermined phase shift pattern is formed. Meanwhile, in a case where a metal as a material of the phase shift film is amorphous, the adverse effect can be reduced when a phase shift pattern is formed. By adding a predetermined element (X) to Ru, the metal as a material of the phase shift film can be made amorphous, and processing characteristics can be improved. As the predetermined element (X), at least one element selected from the group consisting of Cr, Ni, Co, V, Nb, Mo, W, and Re can be selected.

Note that the refractive index n and the extinction coefficient k of Ni are n=0.948 and k=0.073, respectively. As for Co, n=0.933 and k=0.066, and as for Cr, n=0.932 and k=0.039. The refractive index n and the extinction coefficient k of V are n=0.944 and k=0.025, respectively. The refractive index n and the extinction coefficient k of Nb are n=0.933 and k=0.005, respectively. The refractive index n and the extinction coefficient k of Mo are n=0.923 and k=0.007, respectively. The refractive index n and the extinction coefficient k of W are n=0.933 and k=0.033, respectively. The refractive index n and the extinction coefficient k of Re are n=0.914 and k=0.04, respectively. In a case where a binary material (RuCr, RuNi, or RuCo) obtained by adding the predetermined element (X) to Ru is used, the thickness of the phase shift film can be made thinner than in a case where RuTa is used. In addition, since the extinction coefficients k of Ni and Co are each larger than the extinction coefficient k of Cr, when Ni and/or Co is selected as the element (X), the thickness of the phase shift film can be made thinner than when Cr is selected.

The binary material (RuCr, RuNi, or RuCo) obtained by adding the predetermined element (X) to Ru has better processing characteristics than RuTa. It is difficult to etch oxidized Ta with a chlorine-based gas and an oxygen gas. In particular, since RuCr can be easily etched with a mixed gas of a chlorine-based gas and an oxygen gas, RuCr has excellent processing characteristics.

The binary material (RuCr, RuNi, or RuCo) obtained by adding the predetermined element (X) to Ru has an amorphous structure and can be easily etched with a mixed gas of a chlorine-based gas and an oxygen gas. In addition, these materials can be etched with an oxygen gas. It is considered that the same applies to a ternary material (RuCrNi, RuCrCo, or RuNiCo) and a quaternary material (RuCrNiCo).

In addition to the binary materials described above, binary materials (RuV, RuNb, RuMo, RuW, and RuRe) each obtained by adding V, Nb, Mo, W or Re to Ru have better processability than RuTa. RuW and RuMo have particularly excellent processing characteristics like RuCr.

In addition, the binary material (RuV, RuNb, RuMo, RuW, or RuRe) obtained by adding the predetermined element (X) to Ru has an amorphous structure and can be easily etched with a mixed gas of a chlorine-based gas and an oxygen gas. In addition, these materials can be etched with an oxygen gas. It is considered that the same applies to a ternary material and a quaternary material.

Examples of a material containing titanium (Ti) include a TaTi-based material containing tantalum (Ta) and titanium (Ti). Examples of the TaTi-based material include a TaTi alloy and a TaTi compound containing a TaTi alloy and at least one of oxygen, nitrogen, carbon, and boron. Examples of the TaTi compound include TaTiN, TaTiO, TaTiON, TaTiCON, TaTiB, TaTiBN, TaTiBO, TaTiBON, and TaTiBCON.

The second layer 20 (upper layer) formed on the first layer 18 is formed of an interference layer that reduces the reflectance (absolute reflectance) of the layered film 16 to 2.5% or less by utilizing optical interference. Alternatively, the second layer 20 (upper layer) is formed of an absorption layer that reduces the reflectance (absolute reflectance) of the layered film 16 to 2.5% or less by utilizing a light absorbing effect.

The "interference layer" referred to here is also referred to as an antireflection layer, and reduces the absolute reflectance of the layered film 16 by utilizing optical interference. When the second layer 20 (interference layer) is formed of one layer, by utilizing a canceling effect between light reflected by a surface of the second layer 20 and light reflected by interfaces among the layered film 16, the protective film 14, the first layer 18, and the second layer 20 due to optical interference, the absolute reflectance of the layered film 16 can be reduced to 2.5% or less. When the second layer 20 (interference layer) is formed of a plurality of layers, also by a canceling effect between rays of light reflected by interfaces among the layers due to optical interference, the absolute reflectance of the layered film 16 can be reduced to 2.5% or less. Note that the principle of reflectance reduction utilizing optical interference is known, and is disclosed in, for example, JP 2002-280291 A.

When the second layer 20 is formed of an interference layer, the second layer 20 (interference layer) has a film thickness of preferably 1 nm or more and 20 nm or less, more preferably 3 nm or more and 12 nm or less. The refractive index n of the second layer 20 (interference layer) is preferably 0.85 or more and 0.96 or less, and more preferably 0.88 or more and 0.96 or less.

When the second layer 20 is formed of an interference layer, the second layer 20 is formed of, for example, a material containing Ru. Examples of the material containing Ru are similar to those of the material containing Ru used in the above-described first layer 18.

When the second layer 20 is formed of an absorption layer, the second layer 20 (absorption layer) has a film thickness of preferably 5 nm or more and 70 nm or less, more preferably 8 nm or more and 55 nm or less. The extinction coefficient k of the second layer 20 (absorption layer) is preferably 0.02 or more, and more preferably 0.03 or more. Furthermore, the extinction coefficient k of the second layer 20 (absorption layer) is preferably 0.1 or less.

When the second layer 20 is formed of an absorption layer, the second layer 20 is formed of a material containing at least one element selected from, for example, the group consisting of tantalum (Ta), chromium (Cr), cobalt (Co), and nickel (Ni). Examples of a material containing tantalum (Ta) in this case are similar to those of the material containing tantalum (Ta) used for the above-described first layer 18, but the material preferably contains no oxygen because the extinction coefficient can be larger. Examples of a material containing chromium (Cr) are similar to those of the material containing chromium (Cr) used for the above-described first layer 18, but the material preferably contains no oxygen because the extinction coefficient can be larger.

When the second layer 20 is formed of an absorption layer, as a material of the second layer 20, a Co—X alloy, a Ni—X alloy, or a CoNi—X alloy obtained by adding at least one element (X) of tungsten (W), niobium (Nb), tantalum (Ta), titanium (Ti), zirconium (Zr), hafnium (Hf), yttrium (Y), phosphorus (P), and tin (Sn) to at least one element of cobalt (Co) and nickel (Ni) can be used. The additive element (X) preferably contains tungsten (W), tantalum (Ta) and/or tin (Sn), and more preferably contains tantalum (Ta). By inclusion of the appropriate additive element (X) in the material of the second layer 20, an etching rate can be controlled at an appropriate rate while the extinction coefficient (absorption coefficient) of the second layer 20 is maintained at a high value.

Specifically, as the material of the second layer 20, a simple substance of Co, a simple substance of Ni, $CoTa_3$, $CoTa$, $Co_3Ta$, $NiTa_3$, $NiTa$, or $NiTa_3$ can be preferably used.

A total concentration of cobalt (Co) and nickel (Ni) in the material of the second layer 20 is preferably 10 atomic % or more, and more preferably 20 atomic % or more. The total concentration of cobalt (Co) and nickel (Ni) is preferably 90 atomic % or less, and more preferably 85 atomic % or less.

In a case where the material of the second layer 20 contains cobalt (Co), the concentration of cobalt (Co) is preferably 10 atomic % or more, and more preferably 20 atomic % or more. The concentration of cobalt (Co) is preferably 90 atomic % or less, and more preferably 85 atomic % or less.

In a case where the material of the second layer 20 contains nickel (Ni), the concentration of nickel (Ni) is preferably 10 atomic % or more, and more preferably 20 atomic % or more. The concentration of nickel (Ni) is preferably 90 atomic % or less, and more preferably 85 atomic % or less.

In a case where the additive element (X) is tantalum (Ta), tungsten (W), or tin (Sn), the concentration of tantalum (Ta), tungsten (W), or tin (Sn) is preferably 10 atomic % or more, and more preferably 15 atomic % or more. The concentration of tantalum (Ta), tungsten (W), or tin (Sn) is preferably 90 atomic % or less, and more preferably 80 atomic % or less.

In a case where the additive element (X) of the Co—X alloy is Ta, a composition ratio between Co and Ta (Co:Ta) is preferably 9:1 to 1:9, and more preferably 4:1 to 1:4. When the composition ratio between Co and Ta was 3:1, 1:1, or 1:3, each of samples was subjected to analysis with an X-ray diffractometer (XRD) and cross-sectional transmission electron microscopy (TEM) observation. As a result, in each of the samples, Co and Ta-derived peaks changed in a broad manner, and an amorphous structure was formed.

In a case where the additive element (X) of the Ni—X alloy is Ta, a composition ratio between Ni and Ta (Ni:Ta) is preferably 9:1 to 1:9, and more preferably 4:1 to 1:4. When the composition ratio between Ni and Ta was 3:1, 1:1, or 1:3, each of samples was subjected to analysis with an X-ray diffractometer (XRD) and cross-sectional transmission electron microscopy (TEM) observation. As a result, in each of the samples, Ni and Ta-derived peaks changed in a broad manner, and an amorphous structure was formed.

In a case where the additive element (X) of the CoNi—X alloy is Ta, a composition ratio between CoNi and Ta (CoNi:Ta) is preferably 9:1 to 1:9, and more preferably 4:1 to 1:4.

In addition to the above additive element (X), the Co—X alloy, the Ni—X alloy, or the CoNi—X alloy may each contain another element such as nitrogen (N), oxygen (O), carbon (C), and/or boron (B) as long as there in no large influence on the refractive index and the extinction coefficient.

[Case where the Aspect of the Layered Film is the Above (2)]

Next, the case where the aspect of the layered film 16 is the above (2) will be described.

In the case of the above (2), the layered film 16 including the first layer 18 and the second layer 20 functions as a phase shift film.

The reflectance (relative reflectance) of the layered film 16 including the first layer 18 and the second layer 20 with respect to EUV light is preferably 3% or more and 40% or less. Here, the "relative reflectance" is a reflectance of EUV light reflected by the layered film 16 when a reflectance of EUV light reflected by the multilayer reflective film 12 (including the multilayer reflective film 12 with the protective film 14) in a portion having no layered film 16 is assumed to be 100%.

EUV light reflected by the layered film 16 preferably has a phase difference of 160 to 200° with respect to EUV light reflected by the multilayer reflective film 12 (including the multilayer reflective film 12 with the protective film 14) exposed by removing the layered film 16 by etching or the like. That is, the layered film 16 is preferably formed of a phase shift film that causes a phase difference of 160 to 2000 with respect to EUV light.

The second layer 20 (upper layer) is preferably formed of an interference layer that shifts the phase of EUV light reflected by the layered film 16 by utilizing optical interference.

The "interference layer" referred to here enhances the reflectance of the layered film 16 by utilizing optical interference contrary to the above-described antireflection layer. When the second layer 20 (interference layer) is formed of one layer, by utilizing an enhancing effect between light reflected by a surface of the second layer 20 and light reflected by interfaces among the layered film 16, the protective film 14, the first layer 18, and the second layer 20 due to optical interference, the relative reflectance of the layered film 16 can be enhanced to 3% or more and 40% or less. When the second layer 20 (interference layer) is formed of a plurality of layers, also by an enhancing effect between rays of light reflected by interfaces among the layers due to optical interference, the relative reflectance of the layered film 16 can be enhanced to 3% or more and 40% or less.

In order to obtain a sufficient phase shift effect, the second layer 20 has a film thickness of preferably 1 nm or more and 20 nm or less, more preferably 3 nm or more and 12 nm or less. In addition, the second layer 20 has a refractive index n of preferably 0.85 or more and 0.96 or less, more preferably 0.88 or more and 0.96 or less.

When the second layer 20 is formed of an interference layer, the second layer 20 is formed of, for example, a material containing Ru. Examples of the material containing Ru are similar to those of the material containing Ru used in the first layer 18 in the case of the above (1).

In a case where the aspect of the layered film 16 is the above (2), the first layer 18 (lower layer) is formed of an absorption layer having an absolute reflectance of 2.5% or less with respect to EUV light (binary type). The absolute reflectance of the absorption layer is more preferably 2% or less. The "absolute reflectance" referred to here means the reflectance of EUV light reflected by the first layer 18 (a ratio between incident light intensity and reflected light intensity).

The first layer 18 is formed of a material containing at least one element selected from, for example, the group consisting of tantalum (Ta), chromium (Cr), cobalt (Co), and nickel (Ni). Examples of a material containing tantalum (Ta) in this case are similar to those of the material containing tantalum (Ta) used in the first layer 18 in the case of the above (1). Examples of a material containing chromium (Cr) are similar to those of the material containing chromium (Cr) used in the first layer 18 in the case of the above (1). Examples of a material containing cobalt (Co) are similar to those of the material containing cobalt (Co) used in the first layer 18 in the case of the above (1). Examples of a material containing nickel (Ni) are similar to those of the material containing nickel (Ni) used in the first layer 18 in the case of the above (1).

Note that in the above description, the relative reflectance and the absolute reflectance can be converted to each other. For example, when the absolute reflectance of the multilayer reflective film 12 (including the protective film 14) is 68%, the relative reflectance and the absolute reflectance can be converted to each other by the following formula.

Relative reflectance (%)=Absolute reflectance (%)× (100/68)

In the reflective mask blank 100 of the present embodiment, a resist film 24 may be formed on the layered film 16. This aspect is illustrated in FIG. 1. A pattern is drawn on the resist film 24 with an electron beam drawing device and exposed to light, and then the resulting product is subjected to a development step to form a resist pattern. By performing dry etching on the layered film 16 using this resist pattern as a mask, a pattern (layered film pattern) can be formed on the layered film 16.

<Reflective Mask and Method for Manufacturing the Reflective Mask>

Using the reflective mask blank 100 of the present embodiment, a reflective mask of the present embodiment can be manufactured. Hereinafter, an example of a method for manufacturing the reflective mask will be described.

The method for manufacturing the reflective mask will also be described in each of a case where the aspect of the layered film 16 is the above (1) and a case where the aspect of the layered film 16 is the above (2).

[Case where the Aspect of the Layered Film is the Above (1)]

In a case where the aspect of the layered film 16 is the above (1), the first layer 18 (lower layer) is formed of a phase shift film that shifts the phase of EUV light by 160 to 200°. The second layer 20 (upper layer) is formed of an interference layer that reduces the reflectance (absolute reflectance) of the layered film 16 to 2.5% or less by utilizing optical interference. Alternatively, the second layer 20 (upper layer) is formed of an absorption layer that reduces the reflectance (absolute reflectance) of the layered film 16 to 2.5% or less by utilizing a light absorbing effect. Hereinafter, a case where the second layer 20 is formed of an absorption layer will be described.

FIGS. 2A-2H are schematic views illustrating a method for manufacturing the reflective mask 200.

Figure 2A:
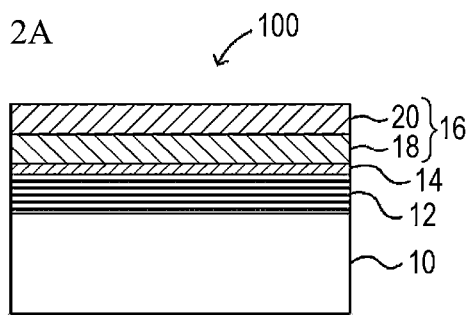
FIGS. 2A-2H are schematic views illustrating a method for manufacturing a reflective mask in a case where an aspect of a layered film is (1).
Figure 2B:
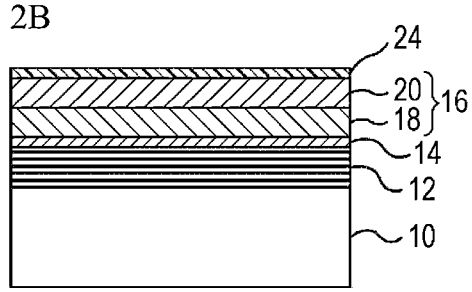
Figure 2C:
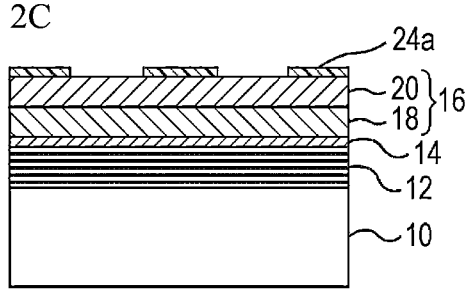

As illustrated in FIGS. 2A-2H, first, the reflective mask blank 100 including the substrate 10, the multilayer reflective film 12 formed on the substrate 10, the protective film 14 formed on the multilayer reflective film 12, and the layered film 16 (first layer 18 and second layer 20) formed on the protective film 14 is prepared (FIG. 2A). Next, a first resist film 24 is formed on the layered film 16 (FIG. 2B). A pattern is drawn on the first resist film 24 with an electron beam drawing device, and then the resulting product is subjected to a development and rinse step to form a first resist pattern 24a (FIG. 2C).

Figure 2D:
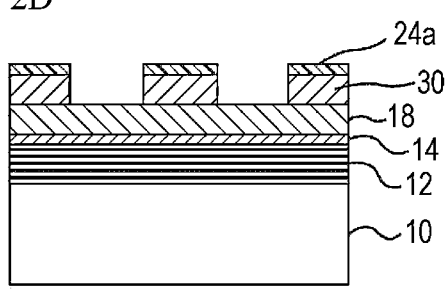

The second layer 20 (upper layer) is dry-etched using the first resist pattern 24a as a mask. As a result, a portion not covered with the first resist pattern 24a in the second layer 20 is etched to form an absorption layer pattern 30 (FIG. 2D).

Note that as an etching gas for dry-etching the second layer 20, an etching gas having etching selectivity with the first layer 18 only needs to be used. As the etching gas, a fluorine-based gas and/or a chlorine-based gas can be used depending on a material of the second layer 20. As the fluorine-based gas, $CF_4$, $CHF_3$, $C_2F_6$, $C_3F_6$, $C_4F_6$, $C_4F_8$, $CH_2F_2$, $CH_3F$, $C_3F_8$, $SF_6$, $F_2$, or the like can be used. As the chlorine-based gas, $Cl_2$, $SiCl_4$, $CHCl_3$, $CCl_4$, $BCl_3$, or the like can be used. In addition, a mixed gas containing a fluorine-based gas and/or a chlorine-based gas and $O_2$ at a predetermined ratio can be used. These etching gases can each further contain an inert gas such as He and/or Ar, if necessary.

Figure 2E:
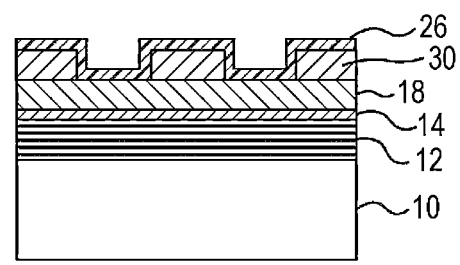
Figure 2F:
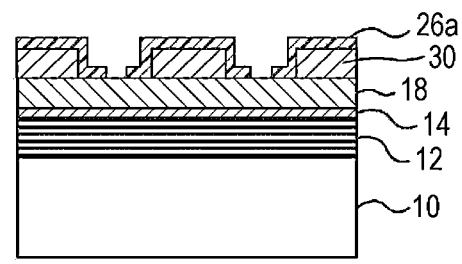

After the absorption layer pattern 30 is formed, the first resist pattern 24a is removed with a resist peeling liquid. After the first resist pattern 24a is removed, a second resist film 26 is formed on the absorption layer pattern 30 and the first layer 18 (FIG. 2E). A pattern is drawn on the second resist film 26 with an electron beam drawing device, and then the resulting product is subjected to a development and rinse step to form a second resist pattern 26a (FIG. 2F).

Figure 2G:
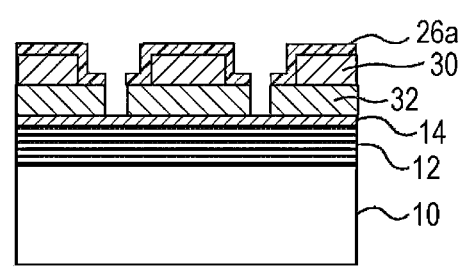

The first layer 18 (lower layer) is dry-etched using the second resist pattern 26a as a mask. As a result, a portion not covered with the second resist pattern 26a in the first layer 18 is etched to form a phase shift pattern 32 (FIG. 2G).

Note that as an etching gas for dry-etching the first layer 18, an etching gas having etching selectivity with the protective film 14 only needs to be used. As the etching gas, a fluorine-based gas and/or a chlorine-based gas can be used depending on a material of the first layer 18. As the fluorine-based gas, $CF_4$, $CHF_3$, $C_2F_6$, $C_3F_6$, $C_4F_6$, $C_4F_8$, $CH_2F_2$, $CH_3F$, $C_3F_8$, $SF_6$, $F_2$, or the like can be used. As the chlorine-based gas, $Cl_2$, $SiCl_4$, $CHCl_3$, $CCl_4$, $BCl_3$, or the like can be used. In addition, a mixed gas containing a fluorine-based gas and/or a chlorine-based gas and $O_2$ at a predetermined ratio can be used. These etching gases can each further contain an inert gas such as He and/or Ar, if necessary.

Figure 2H:
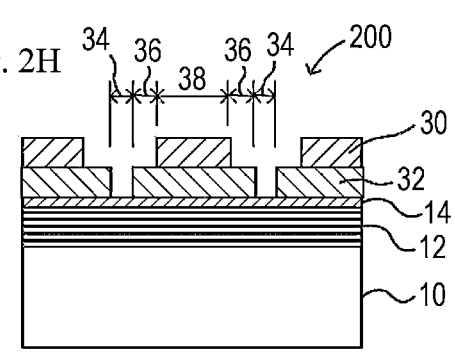

After the phase shift pattern 32 is formed, the second resist pattern 26a is removed with a resist peeling liquid. After the second resist pattern 26a is removed, the resulting product is subjected to a wet cleaning step using an acidic or alkaline aqueous solution to obtain the reflective mask 200 of the present embodiment (FIG. 2H).

The reflective mask 200 thus obtained has a structure in which the multilayer reflective film 12, the protective film 14, the phase shift pattern 32, and the absorption layer pattern 30 are layered in this order from the substrate 10 side.

A region 34 where the multilayer reflective film 12 (including the protective film 14) is exposed has a function of reflecting EUV light. A region 36 where the multilayer reflective film 12 (including the protective film 14) is covered only with the phase shift pattern 32 is a phase shift type region, and can enhance the contrast of a pattern transfer image. A region 38 where the multilayer reflective film 12 (including the protective film 14) is covered with the phase shift pattern 32 and the absorption layer pattern 30 is a binary type region and has a function of preventing a resist film formed on a transfer target from being photosensitized by light reflected by (leaking from) the phase shift pattern 32.

Note that the method for manufacturing the reflective mask 200 is not limited to this. After the region 34 where the multilayer reflective film 12 (including the protective film 14) is exposed is formed first, the region 36 where the multilayer reflective film 12 (including the protective film 14) is covered only with the phase shift pattern 32 may be formed.

[Case where the Aspect of the Layered Film is the Above (2)]

In a case where the aspect of the layered film 16 is the above (2), the layered film 16 including the first layer 18 and the second layer 20 functions as a phase shift film. The second layer 20 (upper layer) is formed of an interference layer that shifts the phase of EUV light reflected by the layered film 16 by 160 to 200° by utilizing optical interference. The first layer 18 (lower layer) is formed of an absorption layer having an absolute reflectance of 2.5% or less with respect to EUV light (binary type).

FIGS. 3A-3H are schematic views illustrating a method for manufacturing the reflective mask 200.

As illustrated in FIG. 3A-3H, first, the reflective mask blank 100 including the substrate 10, the multilayer reflective film 12 formed on the substrate 10, the protective film 14 formed on the multilayer reflective film 12, and the layered film 16 (first layer 18 and second layer 20) formed on the protective film 14 is prepared (FIG. 3A). Next, the first resist film 24 is formed on the layered film 16 (FIG. 3B). A pattern is drawn on the first resist film 24 with an electron beam drawing device, and then the resulting product is subjected to a development and rinse step to form the first resist pattern 24a (FIG. 3C).

The layered film 16 (first layer 18 and second layer 20) is dry-etched using the first resist pattern 24a as a mask. The first layer 18 and the second layer 20 are subjected to two-step etching using an etching gas having etching selectivity between the first layer 18 and the second layer 20. As a result, a portion not covered with the first resist pattern 24a in the layered film 16 is etched to form a layered film pattern 40 (phase shift pattern) (FIG. 3D).

As the etching gas for the first layer 18 and the second layer 20, a fluorine-based gas and/or a chlorine-based gas can be used depending on materials of the first layer 18 and the second layer 20. As the fluorine-based gas, $CF_4$, $CHF_3$, $C_2F_6$, $C_3F_6$, $C_4F_6$, $C_4F_8$, $CH_2F_2$, $CH_3F$, $C_3F_8$, $SF_6$, $F_2$, or the like can be used. As the chlorine-based gas, $Cl_2$, $SiCl_4$, $CHCl_3$, $CCl_4$, $BCl_3$, or the like can be used. In addition, a mixed gas containing a fluorine-based gas and/or a chlorine-based gas and $O_2$ at a predetermined ratio can be used. These etching gases can each further contain an inert gas such as He and/or Ar, if necessary.

Note that as an etching gas for dry-etching the first layer 18, an etching gas having etching selectivity with the protective film 14 only needs to be used.

After the layered film pattern 40 is formed, the first resist pattern 24a is removed with a resist peeling liquid. After the first resist pattern 24a is removed, the second resist film 26 is formed on the layered film pattern 40 (FIG. 3E). A pattern is drawn on the second resist film 26 with an electron beam drawing device, and then the resulting product is subjected to a development and rinse step to form the second resist pattern 26a (FIG. 3F).

The second layer 20 (upper layer) is dry-etched using the second resist pattern 26a as a mask. As a result, a portion not covered with the second resist pattern 26a in the second layer 20 is etched to expose the first layer 18 that has been under the second layer 20. The exposed first layer 18 forms an absorption layer pattern 42 (FIG. 3G).

Note that as an etching gas for dry-etching the second layer 20, an etching gas having etching selectivity with the first layer 18 only needs to be used.

After the absorption layer pattern 42 is formed, the second resist pattern 26a is removed with a resist peeling liquid. After the second resist pattern 26a is removed, the resulting product is subjected to a wet cleaning step using an acidic or alkaline aqueous solution to obtain the reflective mask 200 of the present embodiment (FIG. 3H).

The reflective mask 200 thus obtained has a structure in which the multilayer reflective film 12, the protective film 14, and the layered film pattern 40 are layered on the substrate 10.

A region 44 where the multilayer reflective film 12 (including the protective film 14) is exposed has a function of reflecting EUV light. A region 46 where the multilayer reflective film 12 (including the protective film 14) is covered with the layered film pattern 40 (first layer 18 and second layer 20) is a phase shift type region, and can enhance the contrast of a pattern transfer image. A region 48 where the multilayer reflective film 12 (including the protective film 14) is covered only with the absorption layer pattern 42 (first layer 18) is a binary type region and has a function of preventing a resist film formed on a transfer target from being photosensitized by light reflected by (leaking from) the layered film pattern 40 (phase shift film).

Note that the method for manufacturing the reflective mask 200 is not limited to this. After the region 48 where the multilayer reflective film 12 (including the protective film 14) is covered only with the absorption layer pattern 42 is formed, the region 44 where the multilayer reflective film 12 (including the protective film 14) is exposed may be formed.

<Method for Manufacturing Semiconductor Device>

A transfer pattern can be formed on a semiconductor substrate by lithography using the reflective mask 200 of the present embodiment. This transfer pattern has a shape obtained by transferring a pattern of the reflective mask 200. By forming a transfer pattern on a semiconductor substrate with the reflective mask 200, a semiconductor device can be manufactured.

A method for transferring a pattern onto a semiconductor substrate 56 with resist using EUV light will be described with reference to FIG. 4.

Figure 4:
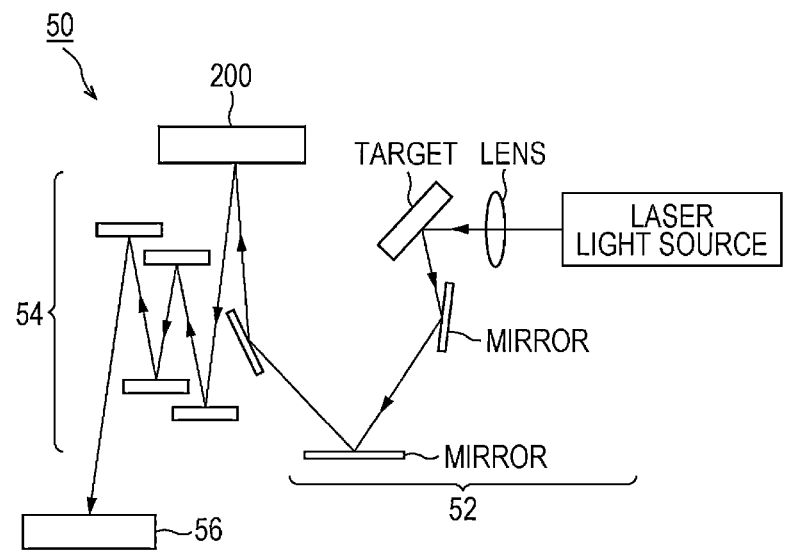
FIG. 4 illustrates a pattern transfer device.

FIG. 4 illustrates a pattern transfer device 50. The pattern transfer device 50 includes a laser plasma X-ray source 52, the reflective mask 200, a reduction optical system 54, and the like. As the reduction optical system 54, an X-ray reflection mirror is used.

A pattern reflected by the reflective mask 200 is usually reduced to about ¼ by the reduction optical system 54. For example, a wavelength band of 13 to 14 nm is used as a light exposure wavelength, and an optical path is set in advance so as to be in a vacuum. Under such conditions, EUV light generated by the laser plasma X-ray source 52 is allowed to enter the reflective mask 200. Light reflected by the reflective mask 200 is transferred onto the semiconductor substrate 56 with resist via the reduction optical system 54.

The light reflected by the reflective mask 200 enters the reduction optical system 54. The light that has entered the reduction optical system 54 forms a transfer pattern on a resist layer on the semiconductor substrate 56 with resist. By developing the resist layer that has been exposed to light, a resist pattern can be formed on the semiconductor substrate 56 with resist. By etching the semiconductor substrate 56 using this resist pattern as a mask, for example, a predetermined wiring pattern can be formed on the semiconductor substrate. A semiconductor device is manufactured through such a step and other necessary steps.

EXAMPLES

Hereinafter, more specific Examples of the present disclosure will be described.

Example 1

A SiO$_2$—TiO$_2$-based glass substrate (6 inch square, thickness 6.35 mm) was prepared. An end face of this glass substrate was chamfered and ground, and further roughly polished with a polishing liquid containing cerium oxide abrasive grains. The glass substrate that had been subjected to these treatments was set in a carrier of a double-sided polishing device, and precisely polished using an alkaline aqueous solution containing colloidal silica abrasive grains as a polishing liquid under predetermined polishing conditions. After the glass substrate was precisely polished, the glass substrate was cleaned. A main surface of the obtained glass substrate had a surface roughness of 0.10 nm or less in terms of root mean square roughness (Rq). The main surface of the obtained glass substrate had a flatness of 30 nm or less in a measurement region of 132 mm×132 mm.

On a back surface of the above glass substrate, a conductive back film formed of CrN was formed under the following conditions by a magnetron sputtering method.

(Conditions): Cr target, Ar+N$_2$ gas atmosphere (Ar: N$_2$=90%:10%), film composition (Cr: 90 atomic %, N: 10 atomic %), film thickness 20 nm By periodically building up a Mo film/Si film on a main surface of the glass substrate opposite to the side where the conductive back film was formed, a multilayer reflective film was formed.

Specifically, using a Mo target and a Si target, a Mo film and a Si film were alternately built up on a substrate by ion beam sputtering (Ar was used). The Mo film had a thickness of 2.8 nm. The Si film had a thickness of 4.2 nm. One period of the Mo/Si film had a thickness of 7.0 nm. Such Mo/Si films were built up for 40 periods, and finally a Si film was formed with a film thickness of 4.0 nm to form a multilayer reflective film.

On the multilayer reflective film, a protective film containing a Ru compound was formed. Specifically, using a RuNb target (Ru: 80 atomic %, Nb: 20 atomic %), a protective film formed of a RuNb film was formed on the multilayer reflective film by DC magnetron sputtering in an Ar gas atmosphere. The protective film had a thickness of 3.5 nm.

Next, on the protective film, a first layer formed of a TaTiN film was formed by a DC magnetron sputtering method. The TaTiN film was formed with a film thickness of 57.3 nm using a TaTi target by reactive sputtering in a mixed gas atmosphere of an Ar gas and a N$_2$ gas. The content ratio of the TaTiN film was Ta:Ti:N=1:1:1.

The refractive index n and the extinction coefficient (refractive index imaginary part) k of the first layer (TaTiN film) at a wavelength of 13.5 nm were as follows, respectively.

TaTiN: n=0.937, k=0.030

The first layer (TaTiN film) had a relative reflectance of 9.1% (absolute reflectance: 6.2%) and a phase difference of 178°.

On the first layer, a second layer (interference layer) was formed with a material containing Ru. Specifically, using a Ru target, a film was formed in an Ar gas atmosphere so as to have a film thickness of 4.5 nm by DC magnetron sputtering.

The layered film including the first layer and the second layer had an absolute reflectance of 1.7% (relative reflectance: 2.5%) and a phase difference of 215°.

As described above, a reflective mask blank in which the protective film, the multilayer reflective film, and the layered film (first layer and second layer) were layered on the substrate was obtained. The reflective mask blank of Example 1 is a reflective mask blank in which the aspect of the layered film is the above (1) and the second layer is an interference layer.

In the reflective mask blank of Example 1, a reflective mask described later was prepared by the method illustrated in FIGS. 2A-2H. At this time, the second layer (upper layer) formed of a Ru film was etched by dry etching using a Cl$_2$ gas and an O$_2$ gas. The first layer (lower layer) formed of a TaTiN film was etched by dry etching using a Cl$_2$ gas.

Example 2

In Example 2, a layered film was formed in which a protective film was formed of a SiO$_2$ film, a first layer (lower layer) was formed of a RuCr film, and a second layer (upper layer) was formed of a TaBN film. Components other than this are similar to those of Example 1.

That is, in Example 2, as in Example 1 above, a conductive back film formed of CrN was formed on a back surface of a SiO$_2$—TiO$_2$-based glass substrate, and a multilayer reflective film was formed on a main surface of the substrate opposite to the back surface.

Next, on a surface of the multilayer reflective film, a protective film formed of a SiO$_2$ film was formed with a film thickness of 2.5 nm in an Ar gas atmosphere by an RF sputtering method using a SiO$_2$ target.

Next, on the protective film, a first layer (lower layer) formed of a RuCr film was formed by a DC magnetron sputtering method. The RuCr film was formed so as to have a film thickness of 32.6 nm using a RuCr target in an Ar gas atmosphere. The content ratio (atomic ratio) of the RuCr film was Ru:Cr=90:10.

The refractive index n and the extinction coefficient (refractive index imaginary part) k of the first layer (RuCr film) formed as described above at a wavelength of 13.5 nm were as follows, respectively.

RuCr film: n=0.890, k=0.019

The relative reflectance of the first layer (RuCr film) formed as described above at a wavelength of 13.5 nm was 19.8% (absolute reflectance: 13.4%), and the phase difference was 179°.

Next, a second layer (upper layer) formed of a TaBN film was formed on the first layer. Using a TaB mixed sintering target (Ta:B=80:20, atomic ratio), the TaBN film was formed in a mixed gas atmosphere of an Ar gas and a N$_2$ gas by reactive sputtering so as to have a film thickness of 30.5 nm. The composition (atomic ratio) of the TaBN film was Ta:B:N=75:12:13.

The refractive index n and the extinction coefficient (refractive index imaginary part) k of the second layer (TaBN film) formed as described above at a wavelength of 13.5 nm were as follows, respectively.

TaBN film: n=0.951, k=0.033

The layered film including the first layer and the second layer had an absolute reflectance of 1.6% (relative reflectance: 2.4%) and a phase difference of 257°.

As described above, a reflective mask blank in which the protective film, the multilayer reflective film, and the layered film (first layer and second layer) were layered on the substrate was obtained. The reflective mask blank of Example 2 is a reflective mask blank in which the aspect of the layered film is the above (1) and the second layer is an absorption layer.

In the reflective mask blank of Example 2, a reflective mask described later was prepared by the method illustrated in FIGS. 2A-2H. At this time, the second layer (upper layer) formed of a TaBN film was etched by dry etching using a $Cl_2$ gas. The first layer (lower layer) formed of a RuCr film was etched by dry etching using a $Cl_2$ gas and an $O_2$ gas.

Example 3

In Example 3, a layered film was formed in which a first layer (lower layer) was formed of a TaBN film, and a second layer (upper layer) was formed of a Ru film. Components other than this are similar to those of Example 1.

That is, in Example 3, as in Example 1 above, a conductive back film formed of CrN was formed on a back surface of a $SiO_2$—$TiO_2$-based glass substrate, a multilayer reflective film was formed on a main surface of the substrate opposite to the back surface, and protective film containing a Ru compound was formed on the multilayer reflective film.

Next, on the protective film, a first layer (lower layer) formed of a TaBN film was formed. Using a TaB mixed sintering target (Ta:B=80:20, atomic ratio), the TaBN film was formed in a mixed gas atmosphere of an Ar gas and a $N_2$ gas by reactive sputtering so as to have a film thickness of 54.0 nm. The composition (atomic ratio) of the TaBN film was Ta:B:N=75:12:13.

The refractive index n and the extinction coefficient (refractive index imaginary part) k of the first layer (TaBN film) formed as described above at a wavelength of 13.5 nm were as follows, respectively.

TaBN film: n=0.951, k=0.033

The first layer (TaBN film) formed as described above had an absolute reflectance of 2.3% (relative reflectance: 3.4%) and a phase difference of 143°.

Next, on the first layer, a second layer (interference layer) was formed with a material containing Ru. Specifically, using a Ru target, a film was formed in an Ar gas atmosphere so as to have a film thickness of 4.5 nm by DC magnetron sputtering.

The layered film (phase shift film) including the first layer and the second layer had a relative reflectance of 8.4% (absolute reflectance: 5.7%) and a phase difference of 183°.

As described above, a reflective mask blank in which the protective film, the multilayer reflective film, and the layered film (first layer and second layer) were layered on the substrate was obtained. The reflective mask blank of Example 3 is a reflective mask blank in which the aspect of the layered film is the above (2).

In the reflective mask blank of Example 3, a reflective mask described later was prepared by the method illustrated in FIGS. 3A-3H. At this time, the second layer (upper layer) formed of a Ru film was etched by dry etching using a $Cl_2$ gas and an $O_2$ gas. The first layer (lower layer) formed of a TaBN film was etched by dry etching using a $Cl_2$ gas.

Example 4

In Example 4, a layered film was formed in which a first layer (lower layer) was formed of a CoTa film, and a second layer (upper layer) was formed of a Ru film. Components other than this are similar to those of Example 1.

That is, in Example 4, as in Example 1 above, a conductive back film formed of CrN was formed on a back surface of a $SiO_2$—$TiO_2$-based glass substrate, a multilayer reflective film was formed on a main surface of the substrate opposite to the back surface, and protective film containing a Ru compound was formed on the multilayer reflective film.

Next, on the protective film, a first layer formed of a CoTa film was formed by a DC magnetron sputtering method. The CoTa film was formed with a film thickness of 54.0 nm using a CoTa target in an Ar gas atmosphere. The content ratio of the CoTa film was Co:Ta=50:50.

The refractive index n and the extinction coefficient (refractive index imaginary part) k of the first layer (CoTa film) formed as described above at a wavelength of 13.5 nm were as follows, respectively.

CoTa: n=0.950, k=0.047

The first layer (CoTa film) formed as described above had an absolute reflectance of 0.8% (relative reflectance: 1.2%) and a phase difference of 124°.

Next, on the first layer, a second layer (interference layer) was formed with a material containing Ru. Specifically, using a Ru target, a film was formed in an Ar gas atmosphere so as to have a film thickness of 4.5 nm by DC magnetron sputtering.

The layered film (phase shift film) including the first layer and the second layer had a relative reflectance of 4.4% (absolute reflectance: 3.0%) and a phase difference of 1780.

As described above, a reflective mask blank in which the protective film, the multilayer reflective film, and the layered film (first layer and second layer) were layered on the substrate was obtained. The reflective mask blank of Example 4 is a reflective mask blank in which the aspect of the layered film is the above (2).

In the reflective mask blank of Example 4, a reflective mask described later was prepared by the method illustrated in FIGS. 3A-3H. At this time, the second layer (upper layer) formed of a Ru film was etched by dry etching using a $Cl_2$ gas and an $O_2$ gas. The first layer (lower layer) formed of a CoTa film was etched by dry etching using a $Cl_2$ gas.

Reference Example

As Reference Example, a reflective mask blank was manufactured in a similar manner to Example 1 except that the second layer (upper layer) formed of a Ru film was not formed.

[Evaluation of Reflective Mask Blank]

Figure 5:
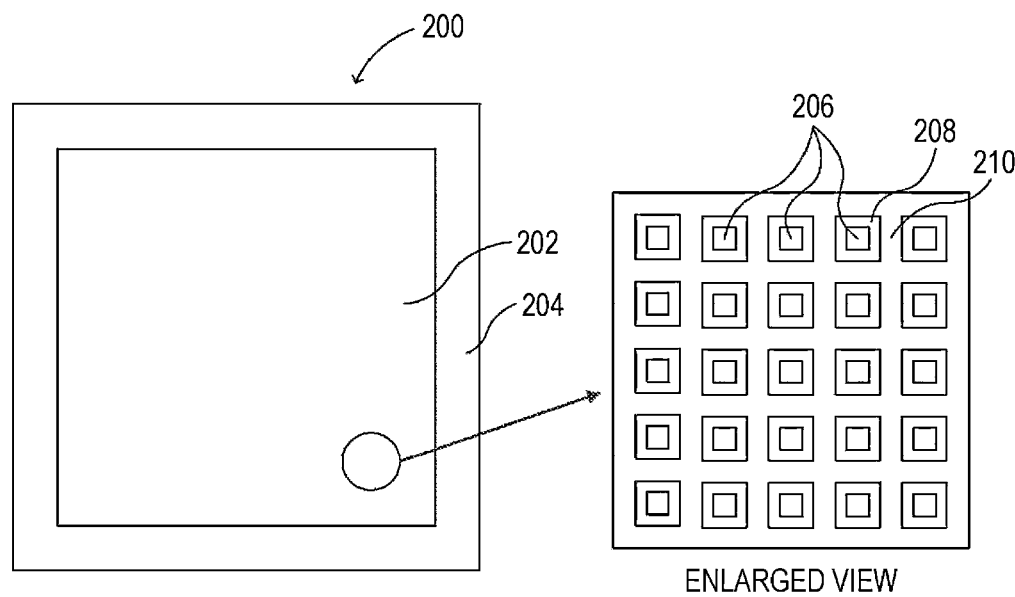
FIG. 5 illustrates a plan view and a partially enlarged view of a reflective mask.

The reflective mask illustrated in FIG. 5 was manufactured using each of the reflective mask blanks of Examples 1 to 4 and Reference Example.

As illustrated in FIG. 5, the reflective mask 200 has a patterned region 202, which is a region formed by densely forming a plurality of contact holes 206, and a non-patterned region 204, which is a region around the patterned region 202. The non-patterned region 204 is covered with a binary type film having an absolute reflectance of 2.5% or less.

That is, when the reflective mask blanks of Examples 1 and 2 are used, the non-patterned region 204 is covered with the first layer and the second layer (binary type). When the reflective mask blanks of Examples 3 and 4 are used, the non-patterned region 204 is covered with the first layer (binary type).

Meanwhile, in the reflective mask blank of Reference Example, the first layer (lower layer) is a phase shift film and does not function as a binary type. Therefore, when the reflective mask blank of Reference Example is used, the non-patterned region 204 is not covered with a binary type film.

As illustrated in the enlarged view on the right side of FIG. 5, a plurality of contact holes 206 is formed at predetermined intervals in the patterned region 202. A phase shift region 208 is formed with a predetermined width around each of the contact holes 206. A binary region 210 is formed further outside the phase shift region 208.

In the contact hole 206, the first layer and the second layer have been removed by etching, and the multilayer reflective film (including the protective film) is exposed. The phase shift region 208 around the contact hole 206 is covered with a phase shift film. The binary region 210 around the phase shift region 208 is covered with a binary type film.

That is, when the reflective mask blanks of Examples 1 and 2 are used, the phase shift region 208 is covered with the first layer (phase shift film). When the reflective mask blanks of Examples 3 and 4 are used, the phase shift region 208 is covered with the first layer and the second layer (phase shift film). When the reflective mask blank of Reference Example is used, the phase shift region 208 is covered with the first layer (phase shift film).

When the reflective mask blanks of Examples 1 and 2 are used, the binary region 210 is covered with the first layer and the second layer (binary type). When the reflective mask blanks of Examples 3 and 4 are used, the binary region 210 is covered with the first layer (binary type).

Meanwhile, in the reflective mask blank of Reference Example, the first layer (lower layer) is a phase shift film and does not function as a binary type. Therefore, when the reflective mask blank of Reference Example is used, the binary region 210 cannot be formed.

Using the reflective mask manufactured as described above, a pattern was transferred onto a resist film on a semiconductor substrate. Thereafter, the resist film that had been exposed to light was developed to form a resist pattern. By etching the semiconductor substrate using the resist pattern as a mask, a pattern formed of a plurality of contact holes was formed on the semiconductor substrate.

When light exposure was performed using a reflective mask manufactured from any of the reflective mask blanks of Examples 1 to 4, a pattern formed of a plurality of contact holes could be accurately transferred onto the semiconductor substrate.

One semiconductor substrate on which a resist film was formed was exposed to light a plurality of times using the same reflective mask while the position of the semiconductor substrate was shifted. Even in this case, reflected light could be prevented from leaking to a region adjacent to a region onto which the pattern was to be transferred on the semiconductor substrate. In addition, the resist film near a boundary between the two adjacent regions could be prevented from being photosensitized by light exposure performed a plurality of times.

Meanwhile, when light exposure was performed using a reflective mask manufactured from the reflective mask blank of Reference Example, a pattern formed of a plurality of contact holes could not be accurately transferred onto the semiconductor substrate. It is presumed that this is because a resist film in a region not to be photosensitized normally is photosensitized by light reflected by the phase shift pattern, and a pattern cannot be accurately transferred onto the resist film on the semiconductor substrate.

In the reflective mask manufactured from the reflective mask blank of Reference Example, the non-patterned region 204 is not covered with a binary type film. Therefore, when one semiconductor substrate was exposed to light a plurality of times while the position of the semiconductor substrate was shifted, reflected light leaked to a region adjacent to a region onto which a pattern was to be transferred on the semiconductor substrate, and the pattern could not be accurately transferred. In addition, the resist film near a boundary between the two adjacent regions could not be prevented from being photosensitized by light exposure performed a plurality of times.

REFERENCE SIGNS LIST

10 Substrate
12 Multilayer reflective film
14 Protective film
16 Layered film
18 First layer
20 Second layer
22 Conductive back film
30 Absorption layer pattern
32 Phase shift pattern
40 Layered film pattern
42 Absorption layer pattern
100 Reflective mask blank
200 Reflective mask

The invention claimed is:

1. A reflective mask blank comprising:
a substrate;
a multilayer reflective film above the substrate; and
a layered film above the multilayer reflective film, wherein
the layered film includes a first layer and a second layer above the first layer,
the first layer comprises at least one element selected from tantalum (Ta), chromium (Cr), ruthenium (Ru) and titanium (Ti), and a refractive index of the first layer is 0.85 or more and 0.96 or less, and
the second layer comprises at least one element selected from tantalum (Ta), chromium (Cr), cobalt (Co), and nickel (Ni), and an extinction coefficient of the second layer is 0.03 or more and 0.1 or less.

2. The reflective mask blank according to claim 1, wherein a film thickness of the second layer is 5 nm or more and 70 nm or less.

3. The reflective mask blank according to claim 1, wherein a film thickness of the first layer is 5 nm or more and 70 nm or less.

4. The reflective mask blank according to claim 1, wherein the first layer comprises tantalum (Ta) and at least one element selected from oxygen (O), nitrogen (N), carbon (C), boron (B), and hydrogen (H).

5. The reflective mask blank according to claim 1, wherein the first layer comprises ruthenium nitride (RuN), or ruthenium (Ru) and at least one element selected from chromium (Cr), nickel (Ni), cobalt (Co), vanadium (V), niobium (Nb), molybdenum (Mo), tungsten (W), and rhenium (Re).

6. The reflective mask blank according to claim 1, wherein the second layer comprises tantalum (Ta) and at least one element selected from oxygen (O), nitrogen (N), carbon (C), boron (B), and hydrogen (H).

7. The reflective mask blank according to claim 1, wherein the second layer comprises chromium (Cr) and at least one element selected from oxygen (O), nitrogen (N), carbon (C), boron (B), and hydrogen (H).

8. The reflective mask blank according to claim 1, further comprising a protective film between the multilayer reflective film and the first layer, wherein
the protective film comprises at least one material selected from the group consisting of a material comprising ruthenium (Ru), a material comprising silicon (Si) and oxygen (O), a material comprising yttrium (Y) and oxygen (O), and a material comprising chromium (Cr).

9. A reflective mask comprising:
a substrate;
a multilayer reflective film above the substrate; and
a layered film pattern above the multilayer reflective film, wherein
the layered film pattern includes a first layer and a second layer above the first layer,
the first layer comprises at least one element selected from tantalum (Ta), chromium (Cr), ruthenium (Ru) and titanium (Ti), and a refractive index of the first layer is 0.85 or more and 0.96 or less, and
the second layer comprises at least one element selected from tantalum (Ta), chromium (Cr), cobalt (Co), and nickel (Ni), and an extinction coefficient of the second layer is 0.03 or more and 0.1 or less.

10. The reflective mask according to claim 9, wherein a film thickness of the second layer is 5 nm or more and 70 nm or less.

11. The reflective mask according to claim 9, wherein a film thickness of the first layer is 5 nm or more and 70 nm or less.

12. The reflective mask according to claim 9, wherein the first layer comprises tantalum (Ta) and at least one element selected from oxygen (O), nitrogen (N), carbon (C), boron (B), and hydrogen (H).

13. The reflective mask according to claim 9, wherein the first layer comprises ruthenium nitride (RuN), or ruthenium (Ru) and at least one element selected from chromium (Cr), nickel (Ni), cobalt (Co), vanadium (V), niobium (Nb), molybdenum (Mo), tungsten (W), and rhenium (Re).

14. The reflective mask according to claim 9, wherein the second layer comprises tantalum (Ta) and at least one element selected from oxygen (O), nitrogen (N), carbon (C), boron (B), and hydrogen (H).

15. The reflective mask according to claim 9, wherein the second layer comprises chromium (Cr) and at least one element selected from oxygen (O), nitrogen (N), carbon (C), boron (B), and hydrogen (H).

16. The reflective mask according to claim 9, further comprising a protective film between the multilayer reflective film and the first layer, wherein
the protective film comprises at least one material selected from the group consisting of a material comprising ruthenium (Ru), a material comprising silicon (Si) and oxygen (O), a material comprising yttrium (Y) and oxygen (O), and a material comprising chromium (Cr).

17. A method for manufacturing a semiconductor device, the method comprising forming a transfer pattern on a semiconductor substrate using the reflective mask according to claim 9.

* * * * *